(12) United States Patent
Starkovich et al.

(10) Patent No.: US 9,810,820 B1
(45) Date of Patent: Nov. 7, 2017

(54) OPTICAL AND MICROWAVE REFLECTORS COMPRISING TENDRILLAR MAT STRUCTURE

(71) Applicant: Northrop Grumman Systems Corporation, Falls Church, VA (US)

(72) Inventors: John A. Starkovich, Redondo Beach, CA (US); Hsiao-Hu Peng, Rancho Palos Verdes, CA (US); Edward M. Silverman, Encino, CA (US)

(73) Assignee: Northrop Grumman Systems Corporation, Falls Church, VA (US)

( * ) Notice: Subject to any disclaimer, the term of this patent is extended or adjusted under 35 U.S.C. 154(b) by 0 days.

(21) Appl. No.: 15/259,228

(22) Filed: Sep. 8, 2016

(51) Int. Cl.
*B29C 37/02* (2006.01)
*G02B 5/08* (2006.01)
(Continued)

(52) U.S. Cl.
CPC ........ *G02B 5/0808* (2013.01); *B29C 37/0025* (2013.01); *B29C 65/48* (2013.01); *B29C 70/083* (2013.01); *B29C 70/44* (2013.01); *B29D 11/0074* (2013.01); *B29D 11/00865* (2013.01); *C23C 14/24* (2013.01); *H01Q 15/14* (2013.01); *B29K 2063/00* (2013.01); *B29K 2079/00* (2013.01); *B29K 2105/0872* (2013.01); *B29K 2105/256* (2013.01); *B29K 2307/04* (2013.01); *B29K 2995/003* (2013.01); *B29K 2995/0011* (2013.01)

(58) Field of Classification Search
CPC ... B29C 37/0025; B29C 65/48; B29C 70/083; B29C 70/44; B29D 11/0074; B29D 11/00865; C23C 14/24; H01Q 15/14
See application file for complete search history.

(56) References Cited

U.S. PATENT DOCUMENTS 6,064,352 A * 5/2000 Silverman ............ H01Q 15/142
343/897
7,022,629 B2 4/2006 Theriault
(Continued)

OTHER PUBLICATIONS

Kim, K. et al; Surface Deformation in a Circular Quasi-Isotropic Laminate Due to Additional Resin Layers; AIAA 2009-2420; 50th AIAA/ASME/ASCE/AHS/ASC Structures, Structural Dynamics, and Materials Conference; May 4-7, 2009; USA; (2009).
(Continued)

*Primary Examiner* — Vishal I Patel
(74) *Attorney, Agent, or Firm* — Patti & Malvone Law Group, LLC

(57) ABSTRACT

A method for manufacturing optical and microwave reflectors includes: placing an assembly comprising a resin-infiltrated tendrillar mat structure on a mandrel; placing a pre-impregnated carbon fiber (CF) lamina on top of the tendrillar mat structure; placing the assembly in a vacuum device so as to squeeze out excess resin; and placing the assembly in a heating device so as to cure the tendrillar mat structure together with the CF lamina, forming the CF laminae into a laminate that combines with the tendrillar mat structure to create a cured assembly. A reflector suitable for one or more of optical and microwave applications includes: a mandrel; a resin-infiltrated tendrillar mat structure placed on the mandrel; and a pre-impregnated carbon fiber (CF) lamina placed on top of the tendrillar mat structure.

9 Claims, 4 Drawing Sheets

(51) Int. Cl.
  *B29C 70/08* (2006.01)
  *B29C 70/44* (2006.01)
  *B29C 65/48* (2006.01)
  *B29D 11/00* (2006.01)
  *B29C 37/00* (2006.01)
  *C23C 14/24* (2006.01)
  *H01Q 15/14* (2006.01)
  *B29K 63/00* (2006.01)
  *B29K 79/00* (2006.01)
  *B29K 105/00* (2006.01)
  *B29K 105/08* (2006.01)
  *B29K 307/04* (2006.01)

(56) References Cited

U.S. PATENT DOCUMENTS

| | | |
|---|---|---|
| 8,486,321 B2 | 7/2013 | Kia |
| 2009/0053493 A1 | 2/2009 | Creel et al. |
| 2009/0151860 A1* | 6/2009 | Carter ................ C08J 5/24 156/148 |
| 2015/0316763 A1 | 11/2015 | Redding et al. |

OTHER PUBLICATIONS

Chen, P.C. et al; Carbon nanotube optical mirrors; Journal of Astronomical Telescopes, Instruments, and Systems; vol. 1, No. 1 (2015): 014005-1 thru 014005-6; Jan.-Mar. 2015.

Chen, P. C. et al; Large aperture nanocomposite deformable mirror technology; In 3rd International Symposium on Advanced Optical Manufacturing and Testing Technologies: Large Mirrors and Telescopes; Proc. of SPIE vol. 6721; pp. 67210R thru 67210R-8; International Society for Optics and Photonics, 2007.

Romeo, R. C. et al; Progress in 1m-class lightweight CFRP composite mirrors for the ULTRA telescope; In SPIE Astronomical Telescopes+ Instrumentation; pp. 62730S-1 thru 627305-12; International Society for Optics and Photonics, 2006.

Kim, K-P. et al; Analysis of surface deformation due to thermal load on circular quasi-isotropic laminate mirrors; In Proceedings 49th AIAA/ASME/ASCE/AHS/ASC Structures, Structural Dynamics, and Materials Conference; AIA 2008-2185; 13 pages; 2008.

Kamiya, T. et al; Improvement of the CFRP Composite Mirror Surface Using a Replica Method; In Proceedings of the 18th International Conference on Composite Materials; 2011.

Massarello, JJ et al; Fiber print-through mitigation technique for composite mirror replication; Optical Engineering; vol. 45, No. 12; pp. 123401-1 thru 123401-8; Dec. 2006.

* cited by examiner

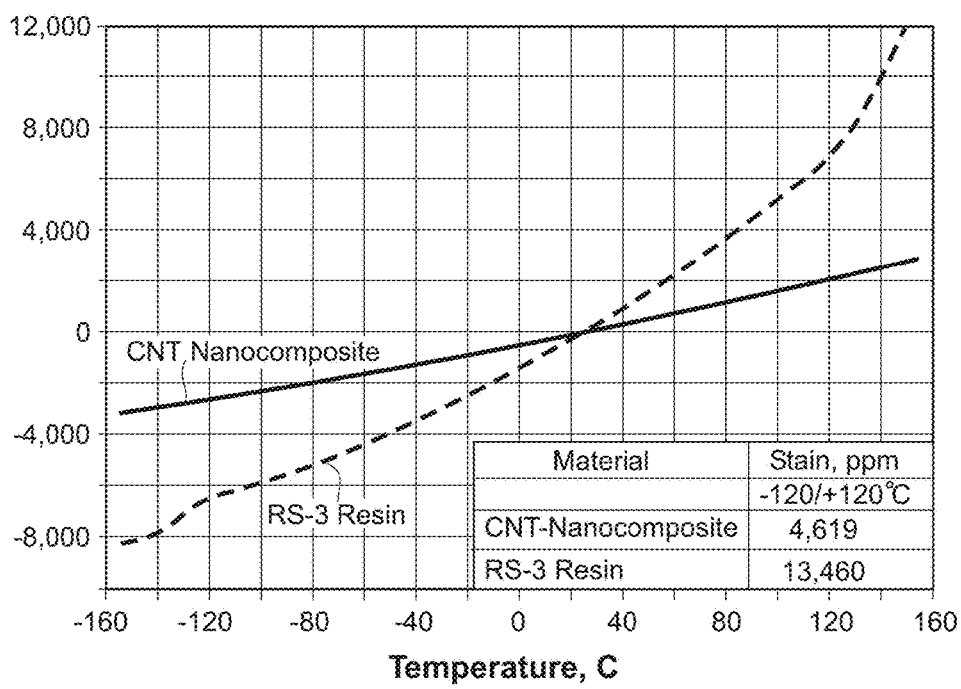

Fig. 4

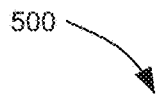

Fig. 5

510 — An assembly comprising a resin-infiltrated mat structure is placed on a mandrel 520 — A pre-impregnated carbon fiber (CF) lamina is placed on top of the tendrillar mat structure 530 — The assembly is placed in a vacuum device so as to squeeze out excess resin 540 — The assembly is placed in a heating device so as to cure the tendrillar mat structure together with the CF lamina, forming the CF laminae into a laminate that combines with the tendrillar mat structure to create a cured assembly

OPTICAL AND MICROWAVE REFLECTORS COMPRISING TENDRILLAR MAT STRUCTURE

SUMMARY

A method for manufacturing optical and microwave reflectors includes: placing an assembly comprising a resin-infiltrated tendrillar mat structure on a mandrel; placing pre-impregnated carbon fiber (CF) laminae on top of the tendrillar mat structure; placing the assembly in a vacuum device so as to squeeze out excess resin; and placing the assembly in a heating device so as to cure the tendrillar mat structure together with the CF lamina, forming the CF laminae into a laminate that forms with the tendrillar mat structure into a cured assembly.

A reflector suitable for one or more of optical and microwave applications includes: a mandrel; a resin-infiltrated tendrillar mat structure placed on the mandrel; and pre-impregnated carbon fiber (CF) laminae placed on top of the tendrillar mat structure.

A reflector suitable for one or more of optical and microwave applications includes: a mandrel; a resin-infiltrated tendrillar mat structure placed on the mandrel; pre-impregnated carbon fiber (CF) laminae placed on top of the tendrillar mat structure; a composite grid support structure edge-bonded to the cured assembly; a rear panel laminate fastened to the composite grid support structure; a reflector layer placed on top of the cured assembly, wherein excess resin is squeezed out by placing the assembly in a vacuum device, and wherein the assembly is placed in a heating device so as to cure the tendrillar mat structure together with the CF laminae, forming the CF laminae into a laminate that combines with the tendrillar mat structure to create a cured assembly.

DESCRIPTION OF THE DRAWINGS

The accompanying drawings provide visual representations which will be used to more fully describe various representative embodiments and can be used by those skilled in the art to better understand the representative embodiments disclosed herein and their advantages. In these drawings, like reference numerals identify corresponding elements.

FIG. 4 is a graph showing thermal expansion properties of optical and microwave reflectors comprising a tendrillar mat structure and of unfilled resin for the specific case of polycyanate resin and CNT composite.

FIG. 5 is a flowchart of a method 500 for manufacturing optical and microwave reflectors comprising a tendrillar mat structure.

DETAILED DESCRIPTION

Figure 1A:
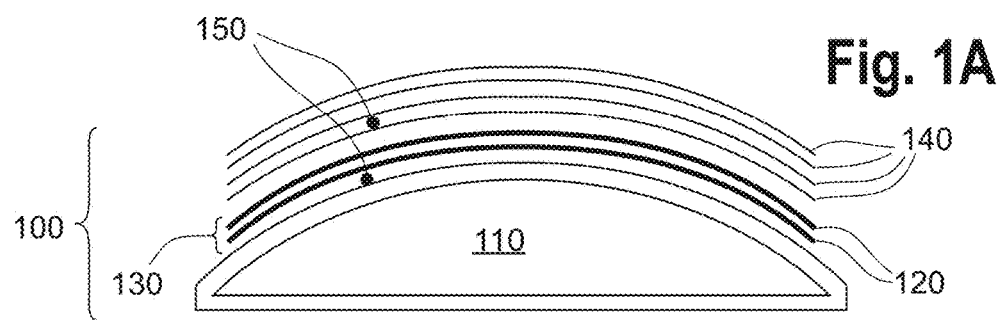
FIGS. 1A-1C are a set of three drawings illustrating a method for manufacturing optical and microwave reflectors comprising a tendrillar mat structure.

While the present invention is susceptible of embodiment in many different forms, there is shown in the drawings and will herein be described in detail one or more specific embodiments, with the understanding that the present disclosure is to be considered as exemplary of the principles of the invention and not intended to limit the invention to the specific embodiments shown and described. In the following description and in the several figures of the drawings, like reference numerals are used to describe the same, similar or corresponding parts in the several views of the drawings.

According to embodiments of the invention, optical and microwave reflectors are provided comprising a tendrillar mat structure. More specifically, lightweight optical and microwave reflectors are provided comprising a tendrillar mat structure. Still more specifically, lightweight, smooth optical and microwave reflectors are provided comprising a tendrillar mat structure. More specifically yet, a method is provided using a mold to produce smooth, lightweight optical and microwave reflectors are provided comprising a tendrillar mat structure.

Optical and microwave reflectors are provided comprising a freestanding tendrillar mat structure. Still more specifically, optical and microwave reflectors are provided comprising a freestanding tendrillar mat structure, wherein the freestanding tendrillar mat structure comprises entangled materials. Still more specifically, optical and microwave reflectors are provided comprising composite isolation layer materials. Still more specifically, optical and microwave reflectors are provided comprising composite isolation layer materials, the composite isolation layer materials comprising one or more of CNT, carbon nanofibers (CNF), filamentous carbon, boron nitride, metallic nanowires, glass nanowires, and ceramic nanowires.

According to embodiments of the invention, a method is provided for manufacturing one or more of a film and a layer of polymer nanocomposites comprising tendrillar carbonaceous particles impregnated with polymer resin. For example, the tendrillar carbonaceous particles comprise a cohesive body of tendrillar carbonaceous particles. For example, the tendrillar carbonaceous particles are useful for producing surfaces usable for one or more of optical reflectors and microwave reflectors. The surfaces that are thereby created have one or more of a high surface quality suitable for optical imaging applications and a reduced thermal strain. For example, the thermal strain is reduced by at least approximately 20%.

For example, the CNT's comprise one or more of single-wall CNT's and multi-wall CNT's. For example, the CNT's comprise tubular shaped CNT's. For example, the CNF's comprise one or of tubular CNF's and solid carbon nanofibers (CNF). For example, the CNF's comprise CNF's with a stacked-cup structure. For example, the filamentous carbon is produced by catalytic decomposition of a carbonaceous gas. For example, the carbonaceous gas comprises one or more of carbon monoxide and another carbonaceous gas. For example, the catalytic deposition is performed at a temperature of at least approximately 450° C. The tendrillar mat structure comprises one or more of randomly-oriented mats, randomly-oriented compresses and randomly-oriented sheets of tendrillar structured carbon particles. For example, the tendrillar mat structure is impregnated with a polymer matrix so that the tendrillar mat structure has isotropic thermo-mechanical properties. The tendrillar mat structure may be applied to the surfaces of one or more of regular carbon fiber composites and other laminate composites to serve as surface isolation layers for one or more of reducing fiber print-through and improving composite surface texture. For example, the tendrillar mat structure may reduce a roughness of the surface of the composite. The tendrillar mat structure is suitable for use in the manufacture of large aperture lightweight replicated composite optics with low areal densities. For example, a large aperture comprises an aperture with a diameter greater than approximately 2 meters. For example, a lightweight replicated composite optics has an areal density less than approximately 10 kilograms per square meter (<10 kg/m$^2$). For example, the tendrillar mat structure is substantially isotropic. For example, the tendrillar mat composite structure is highly loaded, containing as much as 20 to 50 volume percent tendrillar carbon particles. For example the resin-filled tendrillar mat structure comprising tendrillar carbon particles is dimensionally stable, exhibiting a thermal expansion coefficient around 20 ppm/K or higher depending on the particular matrix resin.

According to further embodiments of the invention, the laminate composites can be laid up on a highly-polished precision tool to potentially provide the proper shape and surface quality mirror shell. A metal film can subsequently be vacuum deposited on the replicated mold surface to produce a working reflective mirror. The composite shell can be bonded to a stiff, lightweight carbon-fiber-reinforced polymer (CFRP) composite iso- or orthogrid CFRP structure to make a mirror assembly.

According to embodiments of the invention, the polymer nanocomposite can be used to manufacture one or more of nanocomposite films and nanocomposite laminates having smoothness appropriate for optical and microwave applications.

According to other embodiments of the invention, the mat material comprises randomly oriented tendrillar carbon particles with an open pore structure that can be impregnated with one or more of thermosetting polymer resins and thermoplastic polymer resins to form a composite tendrillar mat structure when cured. For example, the tendrillar mat structure comprises one or more of a nanocomposite film and a nanocomposite laminate. The one or more of nonwoven fabric and mat-like material may be one or more of compressed, stretched, and deformed without significant wrinkling to accommodate mold surfaces that are one or more of planar, having single curvature and having compound curvature.

Figure 1B:
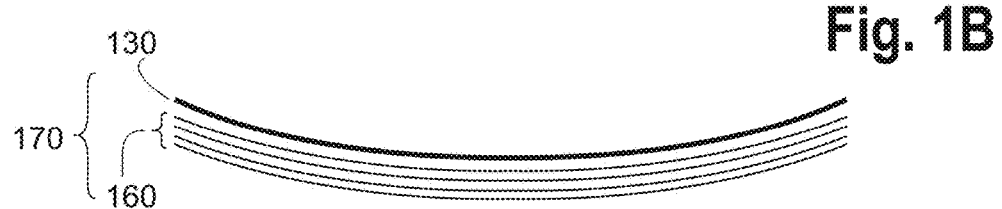
Figure 1C:
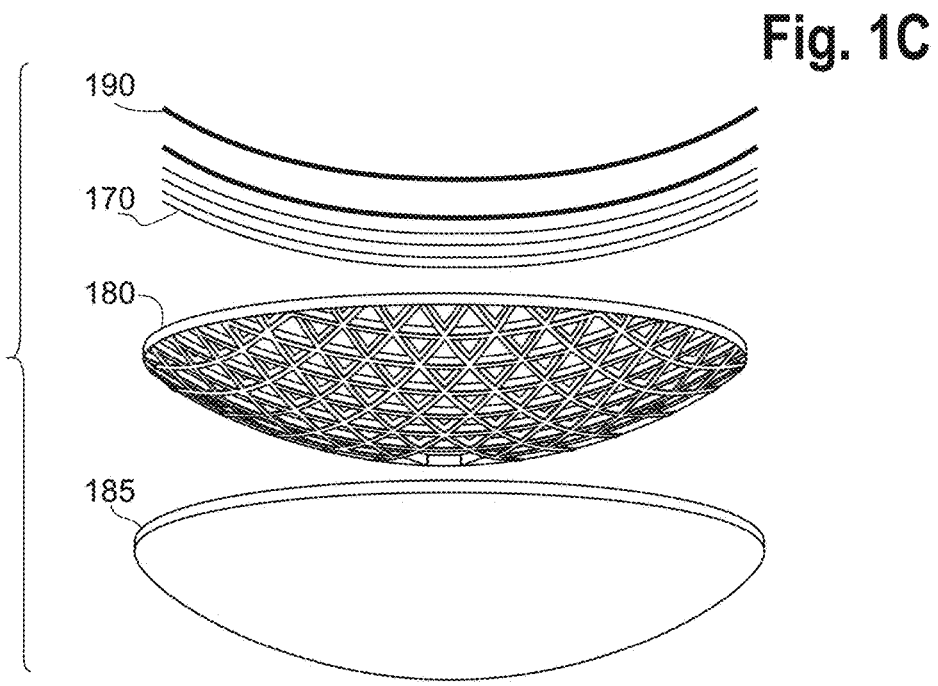

FIGS. 1A-1C are a set of three drawings illustrating a method for manufacturing optical and microwave reflectors comprising a tendrillar mat structure.

In FIG. 1A, an assembly 100 used in manufacturing optical and microwave reflectors comprising a tendrillar mat structure is provided. The assembly 100 sits on a mandrel 110 that is usable as a mold. The assembly 100 comprises a tendrillar mat 120 that is placed on top of the mandrel 110, forming a tendrillar mat structure 130. For example, the tendrillar mat structure 130 comprises a composite isolation layer 130. For example, the tendrillar mat 120 comprises an isolation sheet 120. For example, the tendrillar mat 120 comprises a composite isolation sheet 120. For example, the tendrillar mat 120 comprises a compressible composite isolation sheet 120. For example, the tendrillar mat 120 comprises a nanocomposite material. For example, the tendrillar mat 120 comprises tendrillar carbon particles such as carbon nanotubes (CNT). For example, the tendrillar mat 120 comprises one or more of CNT, carbon nanofibers (CNF), filamentous carbon, boron nitride nanotubes, metallic nanowires, glass nanowires, and ceramic nanowires.

The assembly 100 further comprises one or more carbon fiber (CF) lamina 140 that are placed on top of the tendrillar mat structure 130. For example, the CF lamina 140 comprise uni-directional CF lamina 140 in which substantially all fibers are oriented in one direction. For example, at least approximately 99% of the fibers are oriented in a same direction within a directional tolerance of 1%. For example, the CF lamina 140 comprise between approximately 5,000 and approximately 7,000 fibers per bundle. For example, a representative carbon fiber is approximately seven to approximately ten micrometers (7-10 μm) in diameter. For example, the lamina 140 are so arranged so that the stack is quasi-isotropic. For example, the lamina 140 are non-isotropic. For example, the lamina 140 are isotropic. One or more of the lamina 140 and the tendrillar mat structure 130 is impregnated with resin 150. For example, the lamina 140 and the tendrillar mat structure 130 are both impregnated with the resin 150. For example, the resin 150 comprises one or more of polycyanate and epoxy.

The assembly 100 is placed in a vacuum device (not shown). For example, the vacuum device (not shown) comprises a vacuum bag. Excess resin 150 between layers of the lamina 140 is squeezed out. Excess resin 150 between tendrillar mats 120 is also squeezed out.

For example, the thickness of the tendrillar mat structure 130 may be on the order of approximately several hundred micrometers.

When the lamina 140 and the tendrillar mat structure 130 are compressed against the mandrel 110, the tendrillar mat structure 130 acts somewhat like a porous sponge expelling a small amount of resin 150 at the surface of the mandrel 110 and burying or hiding the lamina 140 from the mandrel 110. The compressed isolation layer 130 effectively hides the lamina 140 from the surface of the mandrel 110. The assembly 100 is removed from the mandrel 110.

In FIG. 1B, the assembly 100 is placed in an oven or other heating device (not shown). Heat curing joins together the tendrillar mat structure 130 and the carbon fiber lamina 140. The lamina 140 collectively form a laminate 160. The laminate 160 and the tendrillar mat structure 130 collectively form a cured assembly 170.

In FIG. 1C, the cured assembly 170 is edge-bonded using an adhesive (not shown) to form a composite grid support structure 180. For example, the composite grid support structure 180 comprises one or more of carbon fiber, glass fiber or ceramic fiber. For example, the composite grid support structure 180 comprises a composite isogrid support structure 180. For example, the composite grid support structure 180 comprises a composite grid support structure 180, wherein the grid elements are comprised of uni-directional carbon or glass fiber laminates and organized in one or more of a rectangular grid, a hexagonal grid, an isogrid, and another grid arrangement. For example, the cured assembly 170 is fastened to the composite grid support structure 180 using an adhesive with a low CTE. For example, the adhesive has a CTE of approximately 10 parts per million (ppm) per Kelvin to approximately 30 ppm per Kelvin.

A rear panel laminate 185 is fastened to the composite grid support structure 180. For example, the rear panel laminate 185 comprises one or more of CFRP, glass fiber reinforced polymer. The rear panel laminate 185 comprises one or more rear panel lamina (not shown). The rear panel laminate 185 is constructed similarly to the construction of the laminate 160 as described above in FIGS. 1A-1B. For example, the rear panel lamina (not shown) comprise CF rear lamina. For example, the rear panel lamina (not shown)

comprise between approximately 5,000 and approximately 7,000 fibers per bundle. For example, a representative carbon fiber is approximately seven to approximately ten micrometers (7-10 μm) in diameter. For example, the rear panel lamina (not shown) are quasi-isotropic. For example, the rear panel lamina (not shown) are non-isotropic. For example, the rear panel lamina (not shown) are isotropic. The rear panel lamina (not shown) are impregnated with resin (not shown). For example, the resin (not shown) has a low coefficient of thermal expansion (CTE). For example, the resin (not shown) comprises one or more of polycyanate and epoxy.

A reflector layer 190 is added on top of the cured assembly 170. For example, the reflector layer comprises a metal film. For example, the reflector layer 190 comprises one or more of silver, aluminum, gold, copper, and nickel. For example, copper and nickel are preferably used in microwave applications, not in optical applications. For example, the reflector layer 190 comprises vapor-deposited metal. For example, the reflector layer 190 has a thickness of approximately 10 nanometers (nm) to approximately 20 nm.

Figure 2:
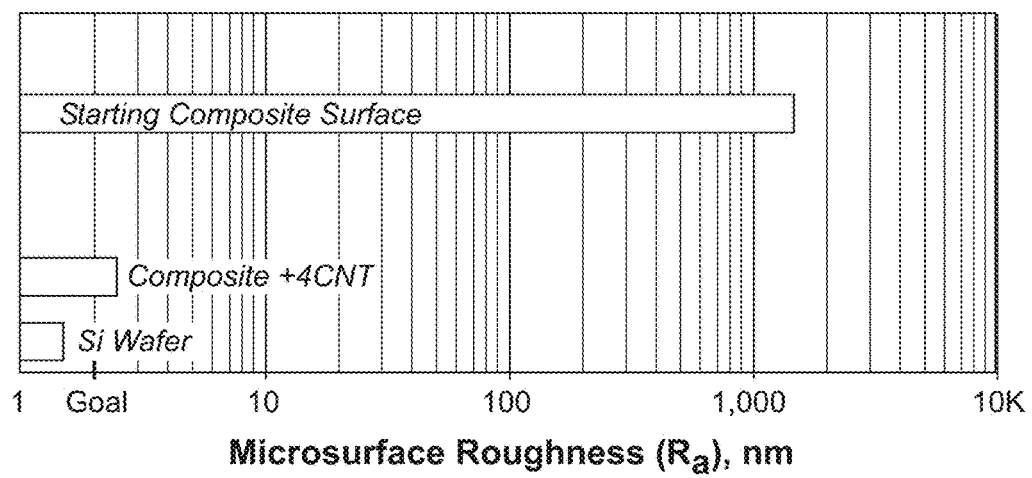
FIG. 2 is a graph showing surface roughness values for an untreated starting surface comprising carbon fiber composite impregnated with resin, of the same carbon fiber composite surface treated with a tendrillar mat structure, and of a polished silicon wafer for reference.

FIG. 2 is a graph showing surface roughness values for an untreated starting surface comprising carbon fiber composite impregnated with resin, of the same carbon fiber composite surface treated with a tendrillar mat structure, and of a polished silicon wafer for reference. FIG. 2 indicates that a goal is to achieve microsurface roughness of no greater than approximately 2 nm $R_a$, a surface roughness of sufficient quality appropriate for optical imaging applications.

FIG. 2 illustrates the success achieved by the method for manufacturing optical and microwave reflectors comprising a tendrillar mat structure. As shown in FIG. 2, a representative roughness of a CF composite sheet is greater than approximately 1,000 nm prior to the use of the composite isolation sheets in carrying out the method for manufacturing optical and microwave reflectors comprising a tendrillar mat structure.

As shown by the second bar, a tendrillar mat structure using a bonded 4-layer CNT tendrillar mat achieves a final microsurface roughness of approximately 2 nm. For comparison, also shown are the only slightly smoother results obtained for a reference surface comprising a polished silicon wafer, of a smoothness of approximately 1.5 nm.

Figure 3:
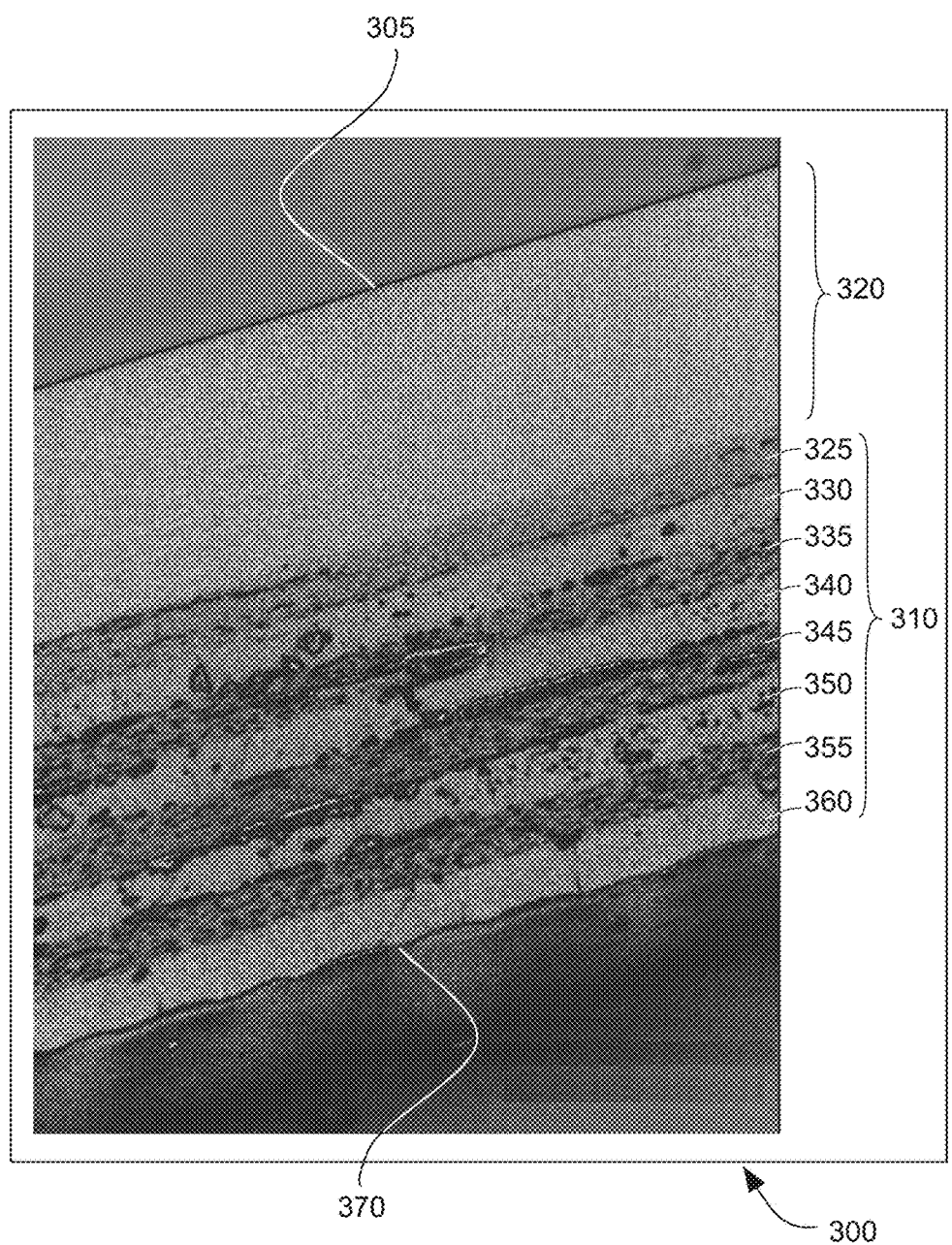
FIG. 3 is a cross-sectional photomicrograph image of optical and microwave reflectors having a replicated mirror surface and comprising a tendrillar mat structure comprising a quasi-isotropic 8-ply carbon-fiber-reinforced polymer (CFRP) laminate and a bonded 4-layer CNT tendrillar mat composite isolation layer.

FIG. 3 is a cross-sectional photomicrograph image of optical and microwave reflectors 300 having a replicated mirror surface 305 and comprising a tendrillar mat structure comprising a quasi-isotropic 8-ply CFRP laminate 310 and a bonded 4-layer CNT composite isolation layer 320. The laminate 310 was molded against a polished silicon wafer and has a total thickness of approximately 860 micrometers (860 μm). The composite isolation layer 320 has a total thickness of approximately 580 micrometers (580 μm). The laminate 310 comprises a first ply 325, a second ply 330, a third ply 335, a fourth play 340, a fifth ply 345, a sixth ply 350, a seventh ply 355, and an eighth ply 360. The individual CF plys 325, 330, 335, 340, 345, 350, 355, 360 are clearly visible while the four nanocomposite plys have been compressed and no interior bond lines are discernible in the photomicrograph. The planarity and smoothness of the replicated silicon wafer are evident from the top molded surface 305 in the photomicrograph.

FIG. 4 is a graph showing thermal expansion properties of optical and microwave reflectors comprising a tendrillar mat structure and of unfilled resin for the specific cases of polycyanate resin and CNT composite and an unfilled polycyanate resin. A benefit provided by embodiments of the invention is its reduced thermal expansion properties. With a typically filled nanocomposite, one can expect to see only minor (10-20%) reduction in the thermal strain relative to unfilled polymer resin, whereas, as can be seen in FIG. 4, the tendrillar mat structure exhibits a 2-5× reduction in thermal strain relative to the pure resin.

Between a temperature of approximately −120° C. and a temperature of approximately +120° C., as can be read off FIG. 4, the CNT nanocomposite exhibits a thermal strain of 4,619 ppm, whereas by contrast in that same temperature range, the RS-3 resin has a strain of 13,460 ppm, or a nearly three-fold thermal strain reduction for the CNT nanocomposite. The reduced thermal strain of the CNT nanocomposite permits it to more closely match the expansion properties of a mirror's reflective metal film and lowers the probability of the CNT nanocomposite undergoing one or more of crazing and cracking during thermal cycling. Thus, embodiments of the invention can provide excellent isolation layers that enable the manufacture of lightweight carbon fiber composite optical and microwave reflectors.

FIG. 5 is a flowchart of a method 500 for manufacturing optical and microwave reflectors. The order of steps in the method 500 is not constrained to that shown in FIG. 5 or described in the following discussion. Several of the steps could occur in different order without affecting the final result.

In step 510, an assembly comprising a resin-infiltrated tendrillar mat structure is placed on a mandrel. Block 510 then transfers control to block 520.

In step 520, a pre-impregnated carbon fiber (CF) lamina is placed on top of the tendrillar mat structure. Block 520 then transfers control to block 530.

In step 530, the assembly is placed in a vacuum device so as to squeeze out excess resin. Block 530 then transfers control to block 540.

In step 540, the assembly is placed in a heating device so as to cure the tendrillar mat structure together with the CF lamina, forming the CF laminae into a laminate that combines with the tendrillar mat structure to create a cured assembly. Block 540 then terminates this process.

The method may further include an additional step, performed after step 540, of edge-bonding the cured assembly to a composite grid support structure.

The method may further include an additional step, performed after the edge-bonding step, of fastening a rear panel laminate to the composite grid support structure.

The method may further include an additional step, performed after the fastening step, of placing a reflector layer on top of the cured assembly.

The step of placing the reflector layer may include depositing a metal film.

The step of placing the reflector layer may include vacuum depositing the metal film.

Embodiments of the invention provide numerous benefits. Embodiments of the invention provide inexpensive, large apertures of approximately 5-30 meters in diameter for use in space. Light scattering and image distortion are minimized according to embodiments of the invention. For example, embodiments of the invention provide light scattering of less than approximately 1 For example, embodiments of the invention provide image distortion of less than approximately 1 Embodiments of the invention provide a solution that is mechanically stable and exhibits approximately 2-5× lower thermal strain relative to pure polymer resin, as shown in FIG. 4. Embodiments of the invention provide one or more of adequate yield stress and adequate bleedout during the compression and elevated temperature cure stages of the replication process. For example, the bleedout is less than approximately 2%. Embodiments of the invention provide high loadings of between approximately 20% and approximately 50%.

Embodiments of the invention avoid a need for casting and polishing large heavy glass or ceramic blanks, as is required by alternative approaches. Embodiments of the invention also avoid issues with one or more of surface figure control and stability. Embodiments of the invention also avoid the complexities and impracticably large number of magnets required by approaches using a nanocomposite isolation layer consisting of ferromagnetic nanoparticles and resin.

It will be further understood by those of skill in the art that the number of variations of the invention and the like are virtually limitless. It is intended, therefore, that the subject matter in the above description shall be interpreted as illustrative and shall not be interpreted in a limiting sense.

While the above representative embodiments have been described with certain components in exemplary configurations, it will be understood by one of ordinary skill in the art that other representative embodiments can be implemented using different configurations and/or different components. For example, it will be understood by one of ordinary skill in the art that the order of certain steps and certain components can be altered without substantially impairing the functioning of the invention.

The representative embodiments and disclosed subject matter, which have been described in detail herein, have been presented by way of example and illustration and not by way of limitation. It will be understood by those skilled in the art that various changes may be made in the form and details of the described embodiments resulting in equivalent embodiments that remain within the scope of the invention. It is intended, therefore, that the subject matter in the above description shall be interpreted as illustrative and shall not be interpreted in a limiting sense.

We claim:

1. A method for manufacturing optical and microwave reflectors, comprising:
   placing an assembly comprising a resin-infiltrated tendrillar mat structure on a mandrel;
   placing a pre-impregnated carbon fiber (CF) lamina on top of the tendrillar mat structure;
   placing the assembly in a vacuum device so as to squeeze out excess resin;
   and placing the assembly in a heating device so as to cure the tendrillar mat structure together with the CF lamina, forming the CF laminae into a laminate that combines with the tendrillar mat structure to create a cured assembly, the cured assembly having a loading of between approximately 20% and approximately 50%, the cured assembly exhibiting a thermal strain that is reduced by two to five times relative to pure resin.

2. The method of claim 1, further comprising an additional step, performed after the step of placing the assembly in a heating device, of:
   edge-bonding the cured assembly to a composite grid support structure.

3. The method of claim 2, further comprising an additional step, performed after the edge-bonding step, of:
   fastening a rear panel laminate to the composite grid support structure.

4. The method of claim 3, further comprising an additional step, performed after the fastening step, of:
   placing a reflector layer on top of the cured assembly.

5. The method of claim 4, wherein the step of placing the reflector layer comprises depositing a metal film.

6. The method of claim 5, wherein the step of placing the reflector layer comprises vacuum depositing the metal film.

7. The method of claim 1, wherein the resin comprises one or more of polycyanate and epoxy.

8. The method of claim 1, wherein the tendrillar mat structure comprises one or more of carbon nanotubes (CNT's), carbon nanofibers (CNF), filamentous carbon, boron nitride nanotubes, metallic nanowires, glass nanowires, and ceramic; nanowires.

9. The method of claim 1, wherein the vacuum device comprises a vacuum bag.

* * * * *